(12) United States Patent
Kim

(10) Patent No.: US 8,964,486 B2
(45) Date of Patent: Feb. 24, 2015

(54) SEMICONDUCTOR DEVICE AND OPERATING METHOD THEREOF

(71) Applicant: SK hynix Inc., Icheon-si Gyeonggi-do (KR)

(72) Inventor: Se Hoon Kim, Gunpo-si (KR)

(73) Assignee: SK Hynix Inc., Gyeonggi-do (KR)

( * ) Notice: Subject to any disclaimer, the term of this patent is extended or adjusted under 35 U.S.C. 154(b) by 293 days.

(21) Appl. No.: 13/706,701

(22) Filed: Dec. 6, 2012

(65) Prior Publication Data

US 2013/0322184 A1    Dec. 5, 2013

(30) Foreign Application Priority Data

May 29, 2012   (KR) .................. 10-2012-0056776

(51) Int. Cl.
*G11C 7/00* (2006.01)
*G11C 7/02* (2006.01)
*G11C 16/10* (2006.01)

(52) U.S. Cl.
CPC .. *G11C 7/00* (2013.01); *G11C 7/02* (2013.01); *G11C 16/10* (2013.01)

USPC ................................ 365/189.05; 365/185.17

(58) Field of Classification Search
USPC ........................... 365/189.05, 185.17, 230.04
See application file for complete search history.

(56) References Cited

U.S. PATENT DOCUMENTS

2008/0094901 A1 * 4/2008 Park et al. ................ 365/185.12
2008/0101120 A1 * 5/2008 Park et al. ................ 365/185.12

* cited by examiner

*Primary Examiner* — Vu Le
(74) *Attorney, Agent, or Firm* — William Park & Associates Patent Ltd.

(57) ABSTRACT

A semiconductor memory device and an operating method thereof are provided. The semiconductor memory device includes: a memory cell array including a plurality of memory cells; and a peripheral circuit programming first, second, third, and fourth memory cells connected to one word line and successively arranged, among the plurality of memory cells, wherein the peripheral circuit is configured to program the first and fourth memory cells in a first interval and program the second and third memory cells in a second interval. A semiconductor memory device having enhanced performance characteristics and an operating method thereof are provided.

11 Claims, 3 Drawing Sheets

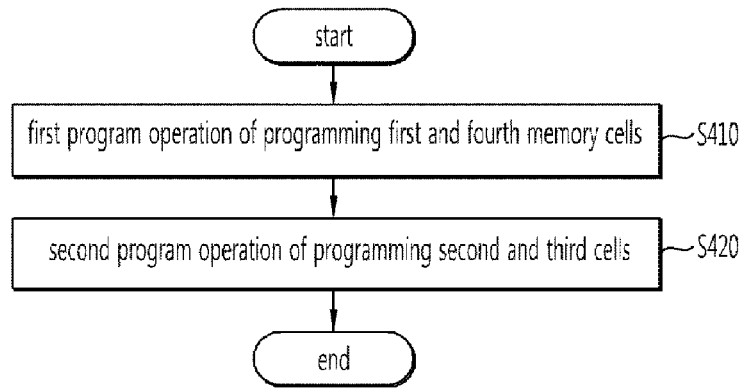
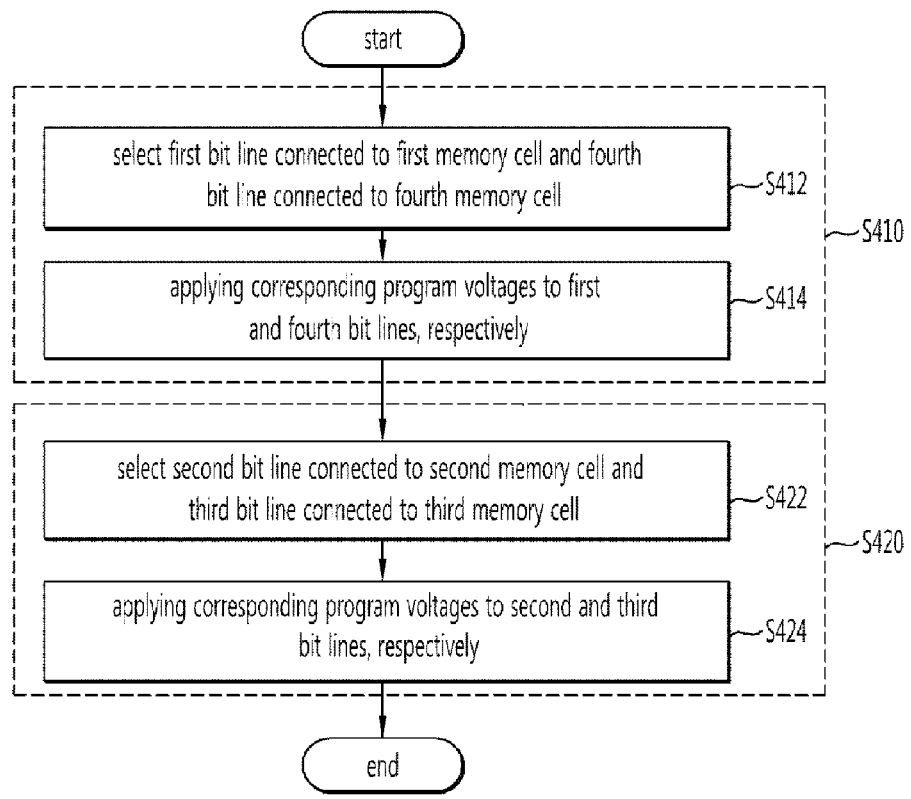

SEMICONDUCTOR DEVICE AND OPERATING METHOD THEREOF

CROSS-REFERENCE TO RELATED APPLICATION

The present application claims priority to Korean patent application number 10-2012-0056776 filed on May 29, 2012, the entire disclosure of which is incorporated herein by reference in its entirety.

BACKGROUND

1. Technical Field

Various embodiments relate to a semiconductor device and an operating method thereof.

2. Related Art

A semiconductor memory device, in particular, a flash memory device, in which data written in a memory cell remains, rather than becoming extinct, although power is not supplied thereto, has continued to be increasingly used as a data storage medium. However, a flash memory device readily malfunctions due to a tendency that a threshold voltage distribution of a programming-completed cell is changed due to various factors caused during a program operation.

FIG. 1 is a view illustrating interference between bit lines made during a program operation. In FIG. 1, a portion of a memory cell array 100 of a general flash memory device is illustrated.

Referring to FIG. 1, first to sixth memory cells MC0~MC5, respectively, are illustrated. The first to third memory cells MC0~MC2, respectively, are connected to a word line WLn, and fourth to sixth memory cells MC3~MC5, respectively, are connected to a word line WLn+1. The memory cells connected to the same word line constitute at least one page. For example, when each memory cell is a single level cell, the first to third memory cells MC0~MC2 connected to the word line WLn and the fourth to six memory cells MC3~MC5 connected to the word line WLn+1 constitute a single page, respectively.

A single page includes an even page and an odd page. The even page includes cells connected to even bit lines BLe. The odd page includes cells connected to odd bit lines BLo. Programming the cells connected to the even bit lines BLe is called even page programming, and programming cells connected to the odd bit lines BLo is called odd page programming. In programming the even page MC1 and the odd pages MC0 and MC2 connected to the same word line, e.g., programming is sequentially performed such that he word line WLn, the even page MC1 is programmed, and subsequently, the odd pages MC0 and MC2 are programmed, so a first programmed page is interfered by a program operation performed on a next page. As a result, a threshold voltage of the page, on which programming was first completed, namely, the even page MC1, may change. The change in the threshold voltage may cause neighboring threshold voltage distributions to overlap. This phenomenon increasingly occurs as the interval between adjacent cells narrows according to a reduction in a cell size of a flash memory device. Thus, a method capable of preventing a degradation of threshold voltage distribution characteristics due to interference between bit lines during a program operation of a flash memory device is required.

BRIEF SUMMARY

Various embodiments relate to a semiconductor memory device having enhanced performance characteristics and an operating method thereof.

A semiconductor memory device according to an embodiment includes: a memory cell array including a plurality of memory cells; and a peripheral circuit configured to program first, second, third, and fourth memory cells connected to a word line and successively arranged, among the plurality of memory cells, wherein the peripheral circuit is configured to program the first and fourth memory cells in a first interval and program the second and third memory cells in a second interval.

An operating method of a semiconductor memory device having first, second, third, and fourth memory cells connected to a word line and arranged successively according to an embodiment, includes a first program operation of programming the first and fourth memory cells; and a second program operation of programming the second and third memory cells.

A semiconductor memory device according to an embodiment includes: a memory cell array including a plurality of memory cells; and a plurality of page buffers configured to perform a program operation on the plurality of memory cells, wherein each of the plurality of page buffers is connected to corresponding memory cells among the plurality of memory cells through a bit line pair, and adjacent bit lines among bit line pairs connected to two mutually neighboring page buffers are selected during a same program operation.

BRIEF DESCRIPTION OF THE DRAWINGS

FIG. 4 is a flow chart illustrating an operating method of a semiconductor memory device.

FIG. 5 is a flow chart illustrating an embodiment of a first program step and a second program step illustrated in FIG. 4.

DETAILED DESCRIPTION

Hereinafter, various embodiments of the present disclosure will be described with reference to the accompanying drawings. The figures are provided to allow those having ordinary skill in the art to understand the scope of the embodiments of the disclosure.

Embodiments will be described with reference to the accompanying drawings.

Figure 1:
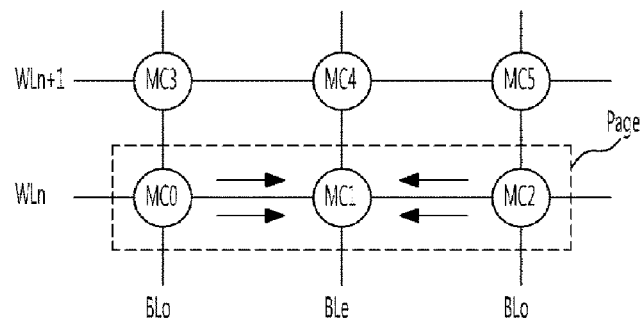
FIG. 1 is a view illustrating a portion of a memory cell array of a general semiconductor memory device.
Figure 2:
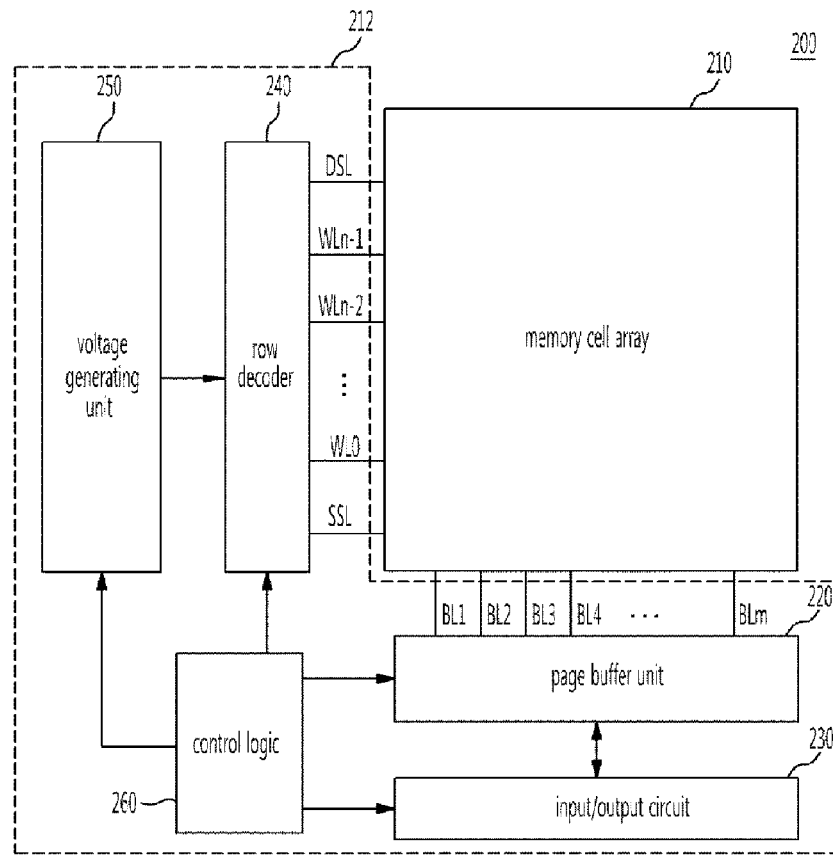
FIG. 2 is a block diagram of a semiconductor memory device according to an embodiment.

FIG. 2 is a block diagram of a semiconductor memory device 200 according to an embodiment.

With reference to FIG. 2, a semiconductor memory device 200 may include a memory cell array 210 including a plurality of memory cells and a peripheral circuit 212 for driving the memory cells of the memory cell array 210. The peripheral circuit 212 according to an embodiment may be configured to program first and fourth memory cells during a first interval and second and third memory cells during a second interval when the first to fourth memory cells are arranged successively.

In an embodiment, as illustrated in FIG. 2, the peripheral circuit 212 may include a page buffer unit 220, an input/output circuit 230, a row decoder 240, a voltage generating unit 250, and a control logic 260.

The memory cell array 210 is a data storage region of the semiconductor memory device 200, including memory cells (not illustrated) connected to bit lines BL and word lines WL. The memory cell array 210 may also be connected to drain selection lines DSL and source selection lines SSL. The respective memory cells of the memory cell array 210 may be in an erased state or programmed state. The respective memory cells may store single bit data or multi-bit data in relation to the programmed state. A memory cell storing single bit data may be called a single level cell (SLC) and a memory cell storing multi-bit data comprised of two or more bits may be called a multi-level cell (MLC). The single level cell SLC has an erased state and a single programmed state according to a threshold voltage. The multi-level cell MLC may be programmed in any one of a plurality of threshold voltage distributions in order to store a plurality of bits in a single cell.

The page buffer unit 220 may be connected to the memory cell array 210 through a plurality of bit lines BLm (i.e., BL1, BL2, BL3, BL4 . . . BLm). The page buffer unit 220 may operate under the control of the control logic 260. The page buffer unit 220 may operate as a write driver or a sense amplifier according to an operation mode. For example, the page buffer unit 220 may operate as a sense amplifier in a read operation mode, and may operate as a write driver in a program operation mode. The page buffer unit 220 may receive data to be programmed during a program operation and may store the received data in an internal latch (not illustrated). During a program operation, the page buffer unit 220 may provide a program voltage, e.g., a ground voltage, to the bit line BLm of the programmed memory cells. During the program operation, the page buffer unit 220 may provide a program inhibition voltage, e.g., a power source voltage, to the bit line BLm of the memory cells inhibited to be programmed. The memory cell array 210 and the page buffer unit 220 will be described later with reference to FIG. 3, and hereinafter, the input/output circuit 230, the low decoder 240, and the voltage generating unit 250 will be described.

The input/output circuit 230 may deliver an address, program data, and a control signal input through an input/output pin to the row decoder 240, the page buffer unit 220, and the control logic 260, respectively. During a read operation, read data provided from the page buffer unit 220 may be output to the outside through the input/output circuit 230.

The row decoder 240 may select word lines WL (i.e., WLn−1, WLn−2 . . . WL0) according to an address. The row decoder 240 may operate under the control of the control logic 260. The row decoder 240 may deliver various operating voltages provided from the voltage generating unit 250 to the word lines WL. During a program operation, the row decoder 240 may deliver a program voltage to a selected word line and may deliver a pass voltage to an unselected word line. During a read operation, the row decoder 240 may provide a read voltage provided from the voltage generating unit 250 to the selected word line, and may provide the pass voltage to the unselected word line.

The voltage generating unit 250 may provide various operating voltages of the semiconductor memory device 200. The voltage generating unit may operate under the control of the control logic 260. The voltage generating unit 250 may include a plurality of pump capacitors, and may be configured to generate a plurality of voltages by using the plurality of pump capacitors.

Figure 3:
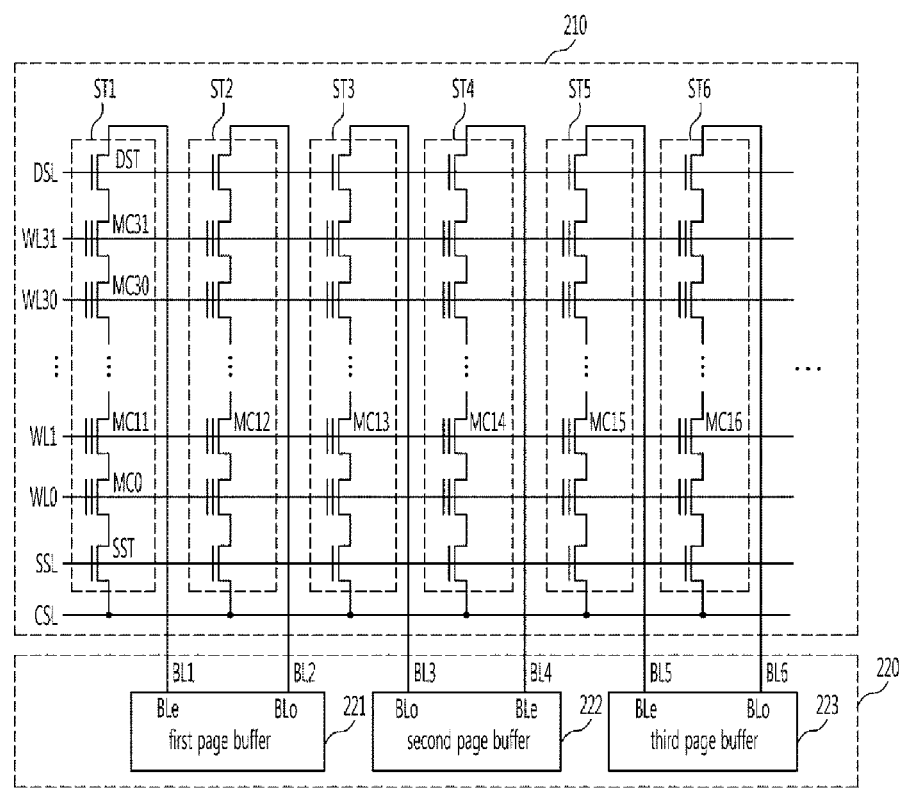
FIG. 3 is a view illustrating an embodiment of a memory cell array and a page buffer unit illustrated in FIG. 2.

FIG. 3 is a view illustrating an embodiment of the memory cell array 210 and the page buffer unit 220 illustrated in FIG. 2.

Referring to FIG. 3, the memory cell array 210 may include a plurality of cell strings ST1~ST6 connected to corresponding bit lines, i.e., first to sixth bit lines BL1~BL6, respectively. In FIG. 3, only six cell strings ST1~ST6 are illustrated for description purposes only. A single cell string may include a drain selection transistor DST connected to a bit line, a source selection transistor SST connected to a common source line CSL, and a plurality of memory cells MC0~MC31 disposed in series between the drain selection transistor DST and the source selection transistor SST. The memory cell array 210 may also include a drain selection line DSL and a source selection line SSL.

The drain selection transistor DST and the source selection transistor SST may be general MOS transistors. The plurality of memory cells MC0~MC31 may be transistors having a charge storage layer such as a floating gate or a charge trap layer.

The page buffer unit 220 may include a plurality of page buffers, namely, first to third page buffers 221~223, respectively.

The page buffers 221~223 may be connected to the memory cell array 210 through a corresponding pair of bit lines, respectively. For example, the first page buffer 221 may be connected to the first cell string ST1 and the second cell string ST2 through the first bit line BL1 the second bit line BL2, respectively. The second page buffer 222 may be connected to the third cell string ST3 and the fourth cell string ST4 through the third bit line BL3 and the fourth bit line BL4, respectively. The third page buffer 223 may be connected to the fifth cell string ST5 and the sixth cell string ST6 through the fifth bit line BL5 and the sixth bit line BL6, respectively.

The bit lines BL1~BL6 may be divided into even bit lines BLe and odd bit lines BLo. According to an embodiment, adjacent bit lines (e.g., BL2 and BL3) among bit lines (e.g., BL1 to BL4) connected to two mutually neighboring page buffers 221 and 222 correspond to the same type of bit lines (e.g., odd bit lines). The first, fourth, and fifth bit lines (BL1, BL4, and BL5) correspond to even bit lines BLe. The second, third, and sixth bit lines BL2, BL3, and BL6 correspond to odd bit lines BLo. The same type of bit lines may be selected from the same operation interval.

According to an embodiment, the even bit lines BL2 may be selected from a first interval to program memory cells MC11, MC14, and MC15, and odd bit lines BLo may be selected from a second interval to program the memory cells MC12, MC13, and MC16. Also, the odd bit lines BLo may be selected from the first interval to program the memory cells MC12, MC13, and MC16, and the even bit lines BLe may be selected from the second interval to program the memory cells MC11, MC14, and MC15. Namely, adjacent bit lines among bit lines connected to two neighboring page buffers may be selected in the same operation interval.

As illustrated in FIG. 3, the memory cell array 210 may include word lines, for example, WL0, WL1 . . . WL30, and WL31. Hereinafter, it is assumed that the first word line WL1 is selected for description purposes only.

The first page buffer 221 may perform an operation on the first memory cell MC11 connected to the first bit line BL1 in a first interval, and may perform an operation on the second memory cell MC12 connected to the second bit line BL2 in a second interval.

The second page buffer 222 may perform an operation on the fourth memory cell MC14 connected to the fourth bit line BL4 in the first interval, and may perform an operation on the third memory cell MC13 connected to the third bit line BL3 in the second interval.

The third page buffer 223 may perform an operation on the fifth memory cell MC15 connected to the fifth bit line BL5 in the first interval, and may perform an operation on the sixth memory cell MC16 connected to the sixth bit line BL6 in the second interval.

For example, during a program operation, the first page buffer 221 may deliver data to the first bit line BL1 connected to the first memory cell in the first interval, and may deliver data to the second bit line BL2 connected to the second memory cell in the second interval. The second page buffer 222 may deliver data to the fourth bit line BL4 connected to the fourth memory cell in the first interval and may deliver data to the third bit line BL3 connected to the third memory cell in the second interval. The third page buffer 223 may deliver data to the fifth bit line BL5 connected to the fifth memory cell in the first interval and may deliver data to the sixth bit line BL6 connected to the sixth memory cell in the second interval.

The first to sixth memory cells MC11~MC16 may be connected to one word line WL1 and arranged successively. Operations on the first, fourth, and fifth memory cells MC11, MC14, and MC15 may be performed in the same interval, and operations on the second, third, and sixth memory cells MC12, MC13, and MC16 may be performed in the same interval. The operations may be program operations or read operations.

According to an embodiment as described above, an influence of a change in a threshold voltage due to interference between bit lines can be reduced in comparison to the related art semiconductor memory device in which the first, third, and fifth memory cells MC11, MC13, and MC15 are programmed, and subsequently, the second, fourth, and sixth memory cells MC13, MC14, and MC16 are programmed. For example, in the semiconductor memory device 200 according to an embodiment, a subject interfered by programming on the second memory cell MC12 in the second interval is limited to the first memory cell MC11. A subject interfered by programming on the third memory cell MC13 in the second interval is limited to the fourth memory cell MC13. Although the second bit line BL2 and the third bit line BL3 corresponding to the second memory cell MC13 and the third memory cell MC13 programmed in the same interval neighbor to each other, interference therebetween is reflected during programming, and thus, the second memory cell MC12 and the third memory cell MC13 are free from a change in a threshold voltage after completion of the programming.

As a result, in the semiconductor memory device 200 according to an embodiment, while a plurality of memory cells connected to one page, i.e., the same word line, are being programmed, coupling or interference generated between the memory cells can be minimized.

FIG. 4 is a flow chart illustrating an operating method of a semiconductor memory device.

Referring to FIG. 4, an operating method of a semiconductor memory device including first to fourth memory cells which are connected to one word line and successively arranged may include a first program operation (S410) of programming the first and fourth memory cells and a second program operation (S420) of programming the second and third memory cells. It is understood that the second and third memory cells neighbor to each other, and the first and fourth memory cells are provided far away or do not neighbor to each other.

FIG. 5 is a flow chart illustrating an embodiment of the first program operation (S410) and a second program operation (S420) illustrated in FIG. 4.

The first program operation (S410) may include an operation (S412) of selecting a first bit line connected to the first memory cell and a fourth bit line connected to the fourth memory cell, and an operation (S414) of applying corresponding program voltages to the first and fourth bit lines, respectively. The second program operation (S420) may include an operation (S422) of selecting a second bit line connected to the second memory cell and a third bit line connected to the third memory cell, and an operation (S424) of applying corresponding program voltages to the second and third bit lines, respectively. The second and third bit lines neighbor to each other. The first page buffer and the second page buffer neighbor to each other.

In accordance with the embodiments, performance characteristics of the semiconductor memory device can be enhanced.

While the present invention has been illustrated and described in connection with the embodiments, it will be apparent to those skilled in the art that modifications and variations can be made without departing from the spirit and scope of the invention as defined by the appended claims.

What is claimed is:

1. A semiconductor memory device comprising:
   a memory cell array including a plurality of memory cells; and
   a peripheral circuit configured to program first, second, third, and fourth memory cells connected to a word line and successively arranged, among the plurality of memory cells,
   wherein the peripheral circuit is configured to program the first and fourth memory cells in a first interval and program the second and third memory cells in a second interval.

2. The semiconductor memory device of claim 1, wherein the peripheral circuit comprises:
   a first page buffer configured to deliver data to a first bit line connected to the first memory cell in the first interval and deliver data to a second bit line connected to the second memory cell in the second interval;
   a second page buffer configured to deliver data to a fourth bit line connected to the fourth memory cell in the first interval and deliver data to a third bit line connected to the third memory cell in the second interval.

3. The semiconductor memory device of claim 1, wherein the peripheral circuit comprises:
   a control logic configured to control the first and second page buffers.

4. The semiconductor memory device of claim 3, wherein the second and third bit lines neighbor to each other.

5. The semiconductor memory device of claim 4, wherein the first and second page buffers neighbor to each other.

6. An operating method of a semiconductor memory device having first, second, third, and fourth memory cells connected to a word line and arranged successively, the method comprising:
   a first program operation of programming the first and fourth memory cells; and
   a second program operation of programming the second and third memory cells.

7. The operating method of claim 6, wherein the first program operation comprises:
   selecting a first bit line connected to the first memory cell and a fourth bit line connected to the fourth memory cell; and
   applying corresponding program voltages to the first and fourth bit lines, respectively.

8. The operating method of claim 7, wherein the second program operation comprises:
   selecting a second bit line connected to the second memory cell and a third bit line connected to the third memory cell; and
   applying corresponding program voltages to the second and third bit lines, respectively.

9. The operating method of claim 8, wherein the second and third bit lines neighbor to each other.

10. A semiconductor memory device comprising:
a memory cell array including a plurality of memory cells; and
a plurality of page buffers configured to perform a program operation on the plurality of memory cells,
wherein each of the plurality of page buffers is connected to corresponding memory cells among the plurality of memory cells through a bit line pair, and
adjacent bit lines among bit line pairs connected to two mutually neighboring page buffers are selected during a same program operation.

11. The semiconductor memory device of claim 10, wherein memory cells connected to the adjacent bit lines are programmed during a first program operation, and
memory cells connected to other remaining bit lines among the bit line pairs connected to the two mutually neighboring page buffers are programmed during a second program operation.

* * * * *